(12) United States Patent
Takeuchi et al.

(10) Patent No.: US 7,602,823 B2
(45) Date of Patent: Oct. 13, 2009

(54) LIGHT-EMITTING ELEMENT

(75) Inventors: Takeshi Takeuchi, Tokyo (JP); Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 17 days.

(21) Appl. No.: 11/848,252

(22) Filed: Aug. 31, 2007

(65) Prior Publication Data
US 2008/0056311 A1   Mar. 6, 2008

(30) Foreign Application Priority Data
Sep. 1, 2006   (JP) .............................. 2006-237388

(51) Int. Cl.
*H01S 3/10* (2006.01)
*H01S 3/08* (2006.01)
*G02B 6/34* (2006.01)

(52) U.S. Cl. .............................. 372/20; 372/92; 385/37

(58) Field of Classification Search .................... 372/20, 372/92
See application file for complete search history.

(56) References Cited

U.S. PATENT DOCUMENTS

| 5,973,824 | A | * | 10/1999 | Sanghera et al. ............ 359/342 |
| 6,289,144 | B1 | * | 9/2001 | Neuschafer et al. ........... 385/12 |
| 6,470,036 | B1 | * | 10/2002 | Bailey et al. .................. 372/20 |
| 6,563,968 | B2 | * | 5/2003 | Davis et al. ................... 385/12 |
| 6,594,288 | B1 | * | 7/2003 | Putnam et al. ................. 372/3 |
| 2003/0021306 | A1 | * | 1/2003 | Fernald et al. ................ 372/20 |
| 2006/0251425 | A1 | * | 11/2006 | Kupershmidt et al. ....... 398/147 |

FOREIGN PATENT DOCUMENTS

| JP | 02-165116 A | 6/1990 |
| JP | 07-082131 B | 9/1995 |

OTHER PUBLICATIONS

Yamazaki et al., "A tunable laser consisting of waveguide ring resonator and semiconductor optical amplifier", IEICE Electronic Society Conference 2005, Proceedings No. C-3-89.

* cited by examiner

*Primary Examiner*—Minsun Harvey
*Assistant Examiner*—Phillip Nguyen
(74) *Attorney, Agent, or Firm*—Young & Thompson (57) ABSTRACT

A light-emitting element includes a light amplification unit and an external resonator. The light amplification unit has a function of amplifying light. The external resonator is connected to the light amplification unit. The external resonator includes a planar light waveguide and a stress application unit. The planar light waveguide is arranged inside the external resonator. The stress application unit applies stress directly or indirectly to at least a partial region of the planar light waveguide.

12 Claims, 5 Drawing Sheets

LIGHT-EMITTING ELEMENT

This application is based upon and claims the benefit of priority from Japanese Patent Application No. 2006-237388, filed on Sep. 1, 2006, the disclosure of which is incorporated herein in its entirety by reference.

BACKGROUND OF THE INVENTION

The present invention relates to a light-emitting element having a function of controlling the phase of light.

A tunable light source capable of oscillating a plurality of wavelengths by a single light source is very useful for a WDM (Wavelength Division Multiplexing) transmission system because it facilitates system reconstruction and reduces the stock of backup light sources, and research and development thereof is flourish in the recent years. Tunable light sources of this type are disclosed in, e.g., reference 1 (Japanese Patent Laid-Open No. 2-165116), reference 2 (Japanese Patent Publication No. 07-082131), and reference 3 (Hiroyuki Yamazaki et al, IEICE Electronic Society Conference 2005, Proceedings No. C-3-89).

A conventional tunable light source will be described with reference to FIGS. 11 and 12. The tunable light source comprises a semiconductor optical amplifier (SOA) 101 with a phase control region, and a ring resonator type wavelength filter 102. The ring resonator type wavelength filter 102 includes a plurality of ring resonators 103 with slightly different optical path lengths, and heaters 104 to control the temperature of the ring resonators 103.

In this tunable light source, the ring resonator type wavelength filter 102 serves as an optical circuit having a function of returning, of light entering from the SOA 101 with a phase control region, only a light component having a specific wavelength to the SOA 101 with a phase control region. The heaters 104 can control the "specific wavelength". The ring resonator type wavelength filter 102 is described in detail in, e.g., reference 3, and a detailed description thereof will not be repeated here.

Figure 12:
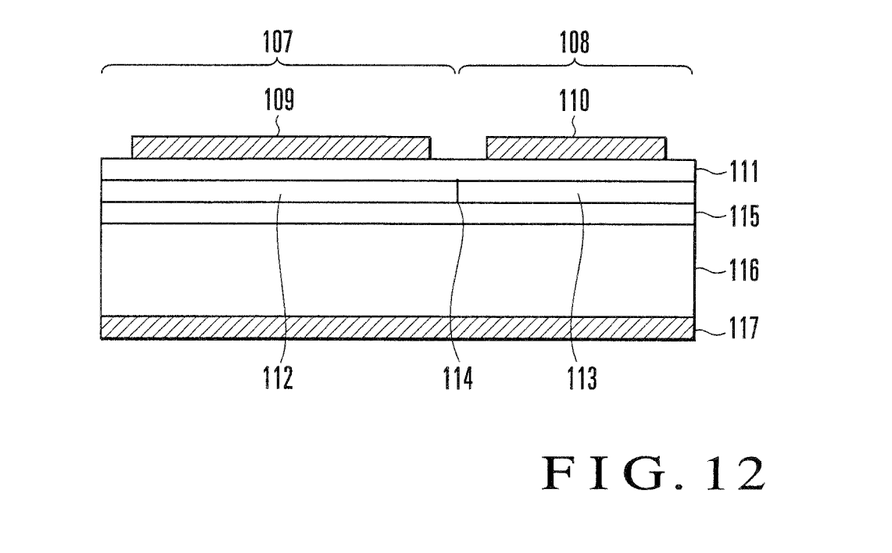
FIG. 12 is a sectional view showing a section of a semiconductor optical amplifier as part of the conventional light-emitting element shown in FIG. 11.

The SOA 101 with a phase control region has a gain region 107 and a phase control region 108, as shown in FIG. 12. The gain region 107 has an active layer 112 and obtains a gain for oscillation by injecting a current in the active layer 112. The phase control region 108 changes the refractive index by injecting a current in a core layer 113, thereby controlling the phase of light so as to obtain the best oscillation characteristic. The core layer 113 in the phase control region 108 is made of a semiconductor layer whose composition (shorter-wavelength composition) is different from that of the active layer 112 in the gain region 107 so that the loss with respect to the oscillation wavelength becomes small. The active layer 112 and core layer 113 are connected by a so-called butt joint 114 formed by an etching process and regrowth process. The SOA 101 with a phase control region is formed by stacking a lower cladding layer 115, the above-described active layer 112 and core layer 113, and an upper cladding layer 111 on a substrate 116. P-electrodes 109 and 110 are formed on the upper cladding layer 111. An n-electrode 117 is formed on the lower surface of the substrate 116.

Figure 11:
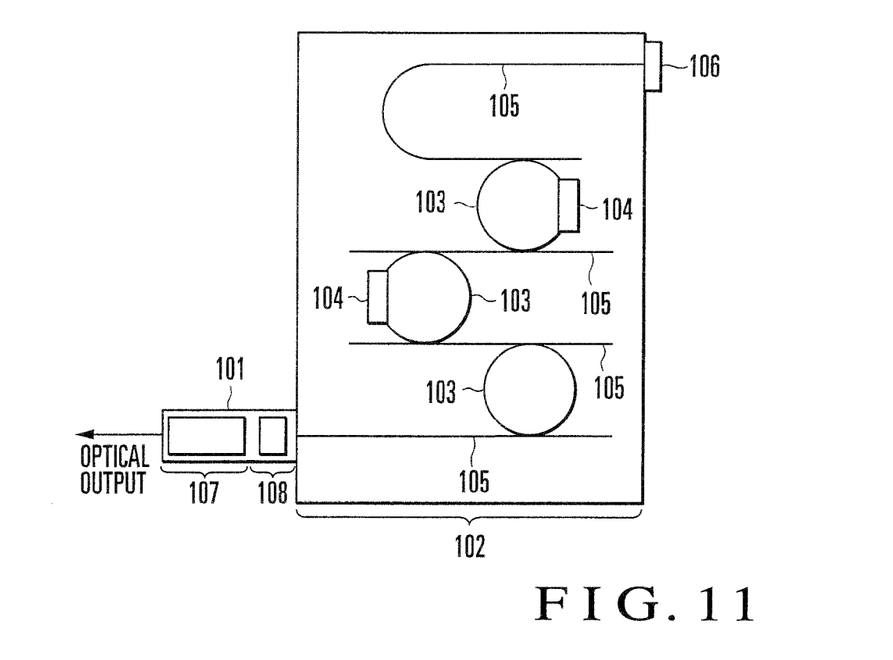
FIG. 11 is a plan view showing the arrangement of a conventional light-emitting element.

As shown in FIG. 11, exit light from the end face on the side of the phase control region 108 enters one end of a connection waveguide 105 of the ring resonator type wavelength filter 102. Exit light from the end face on the side of the gain region 107 is extracted to the outside as the output light of the tunable light source. A high-reflection film 106 is arranged at the other end of the connection waveguide 105 of the ring resonator type wavelength filter 102.

In the conventional tunable light source, light absorption loss occurs in the core layer 113 in the phase control region 108, and the output optical power of the tunable light source lowers. Additionally, light reflection occurs at the butt joint 114 of the SOA 101 with a phase control region. When the reflected light returns to the gain region 107, the oscillation characteristic becomes unstable. Furthermore, the butt joint 114 of the SOA 101 with a phase control region reduces yield in manufacturing elements, resulting in an increase in element manufacturing cost.

SUMMARY OF THE INVENTION

The present invention has been made to solve the above-described problems, and has as its object to eliminate light absorption loss in a light-emitting element.

It is another object to stabilize the oscillation characteristic of a light-emitting element.

It is still another object to reduce the manufacturing cost of a light-emitting element.

In order to achieve the above objects, according to the present invention, there is provided a light-emitting element comprising a light amplification unit having a function of amplifying light, and an external resonator connected to the light amplification unit, the external resonator comprising a planar light waveguide arranged inside the external resonator, and a stress application unit which applies stress directly or indirectly to at least a partial region of the planar light waveguide.

DESCRIPTION OF THE PREFERRED EMBODIMENTS

The embodiments of the present invention will be described below with reference to the accompanying drawings.

First Embodiment

Figure 1:
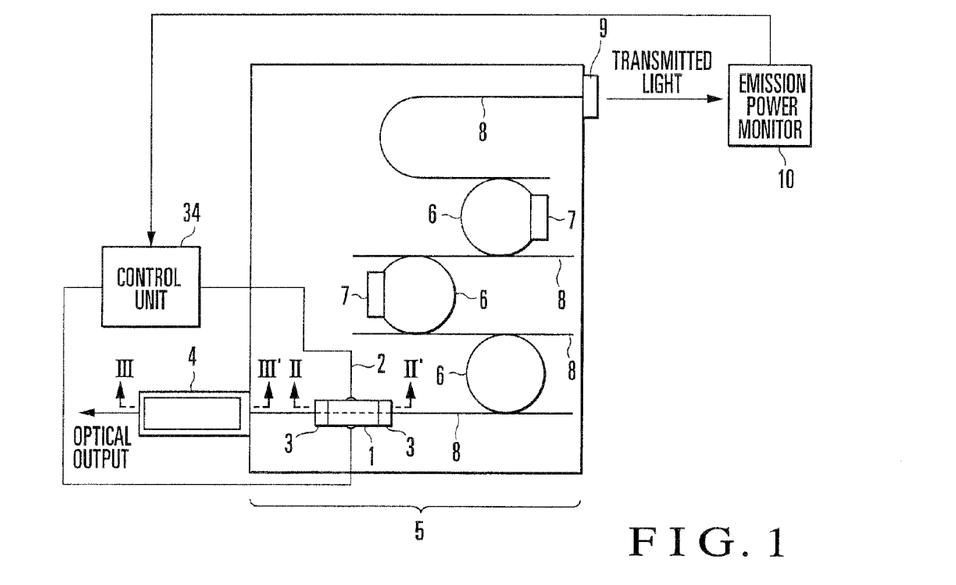
FIG. 1 is a plan view showing the arrangement of a light-emitting element according to the first embodiment of the present invention.
Figure 2:
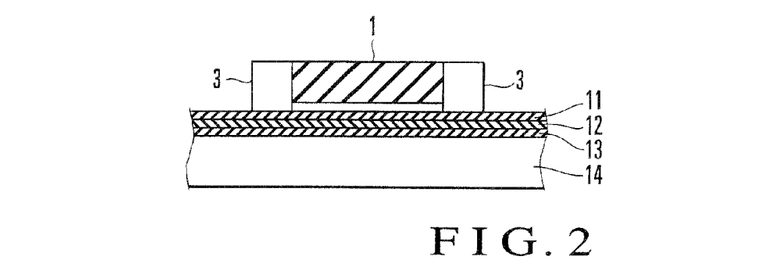
FIG. 2 is a partial sectional view showing a section taken along a line II-II' in FIG. 1.
Figure 3:
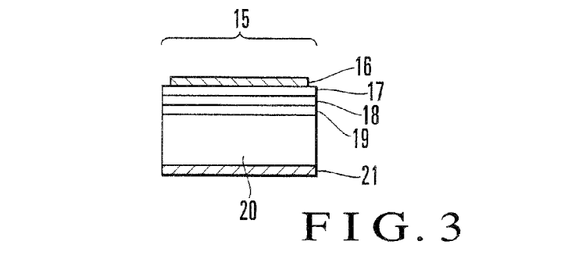
FIG. 3 is a partial sectional view showing a section taken along a line III-III' in FIG. 1.

A light-emitting element according to the first embodiment of the present invention will be described with reference to FIGS. 1 to 3. The light-emitting element of this embodiment comprises a semiconductor optical amplifier (SOA) 4 and a ring resonator type tunable filter unit (external oscillator) 5. The ring resonator type tunable filter unit 5 includes a plurality of ring resonators 6 with slightly different optical path lengths, and heater electrodes (wavelength controllers) 7 to control the temperature of the ring resonators 6. The ring resonator type tunable filter unit 5 has an optical circuit having a function of returning, of light entering from the SOA 4, only a light component having a specific wavelength to the SOA 4. The heater electrodes 7 can control (select) the "specific wavelength".

The light-emitting element of this embodiment uses the SOA 4 having no phase control region, unlike the prior art shown in FIGS. 11 and 12 which uses the SOA 101 with a phase control region. Additionally, the light-emitting element of this embodiment is largely different from the prior art in that a piezoelectric element (stress application unit) 1 fixed on a connection waveguide (planar waveguide) 8 by press jigs 3 is added. In the light-emitting element of this embodiment, the piezoelectric element 1 applies stress to the connection waveguide 8.

The SOA 4 will be described with reference to FIG. 3. The SOA 4 has, on, e.g., an n-type InP substrate 20, a lower cladding layer 19 made of n-type InP, an active layer 18 made of undoped i-type InGaAs, and an upper cladding layer 17 made of p-type InP. The lower cladding layer 19, active layer 18, and upper cladding layer 17 are formed into a ridge shape. A current constriction structure is formed by a buried layer (not shown). A p-electrode 16 is formed on the upper cladding layer 17. An n-electrode 21 is formed on the lower surface of the InP substrate 20. The above-described components construct a gain region 15 of the SOA 4.

The arrangement of the light-emitting element of this embodiment will be described next in association with an example of a manufacturing method. An example of a method of manufacturing the ring resonator type tunable filter unit 5 will be described first with reference to FIGS. 1 and 2. A substrate 14 of, e.g., single-crystal silicon is prepared. A 10-μm thick lower cladding layer 13 of $SiO_2$ and a 2-μm thick SiON layer 12 are sequentially deposited on the substrate 14 by, e.g., CVD. The SiON layer 12 is processed by known photolithography and dry etching, thereby forming the ring resonators 6 (cores of the ring resonators 6) and the connection waveguides 8 (cores of the connection waveguides 8) on the lower cladding layer 13.

A 10-μm thick $SiO_2$ film is deposited on the lower cladding layer 13 to cover the connection waveguides 8, thereby forming an upper cladding layer 11. With this process, waveguides with a planar waveguide structure are formed. A Ti/Pt film is formed on the upper cladding layer 11 of $SiO_2$ by sputtering and processed by known photolithography and dry etching, thereby forming the heater electrodes 7. A high-reflection film 9 is formed by sputtering on the side surface serving as the reflection end of the resonator, thereby completing the ring resonator type tunable filter unit 5. As shown in FIGS. 1 and 2, the piezoelectric element 1 is sandwiched at its two sides by two press jigs 3. The two press jigs 3 are fixed on the connection waveguide 8 by an adhesive. The piezoelectric element 1 is arranged on the connection waveguide 8 which receives light from the SOA 4. Then, the SOA 4 is connected to the input terminal of the ring resonator type tunable filter unit 5. An emission power monitor 10 is arranged at the reflection end where the high-reflection film 9 of the ring resonator type tunable filter unit 5 is formed. The emission power monitor 10 is an example of an emission state monitor that measures the emission state of the light-emitting element.

A control unit (stress control unit) 34 is connected to the piezoelectric element 1 via an electrode line 2. The magnitude of stress applied by the piezoelectric element 1 to the connection waveguide 8 changes depending on the voltage applied from the control unit 34 to the piezoelectric element 1. The emission power monitor 10 is connected to the control unit 34. The control unit 34 adjusts the voltage to be applied to the piezoelectric element 1 on the basis of information from the emission power monitor 10.

The operation and effect of the light-emitting element of this embodiment will be described next. In the prior art shown in FIGS. 11 and 12, the refractive index is changed by injecting a current in the phase control region 108 of the SOA 101 with a phase control region, thereby controlling the phase of light so as to obtain the best oscillation characteristic. In the light-emitting element of this embodiment, however, the piezoelectric element 1 applies stress to the connection waveguide 8 to change its refractive index and physical length, thereby controlling the phase of light so as to obtain the best oscillation characteristic, as shown in FIGS. 1 and 2. More specifically, the control unit 34 controls the voltage to be applied to the piezoelectric element 1 such that the optical power detected by the emission power monitor 10 behind the high-reflection film 9 is maximized. The light-emitting element having this arrangement requires no phase control region 108 of the SOA 101. This solves the problem of high manufacturing cost of the prior art caused by the light absorption loss in the phase control region 108, the unstable oscillation characteristic that results from light reflection at the butt joint 114, and the low manufacturing yield of the butt joint 114.

Second Embodiment

A light-emitting element according to the second embodiment of the present invention will be described next with reference to FIGS. 4 to 8. The light-emitting element of this embodiment has an SOA mounting portion 22 in a partial region of a ring resonator type tunable filter unit 5. An SOA 4 is mounted in the SOA mounting portion 22. The remaining components are the same as in the light-emitting element of the first embodiment described with reference to FIGS. 1 to 3. The arrangement of the SOA mounting portion 22 will be described below.

Figure 6:
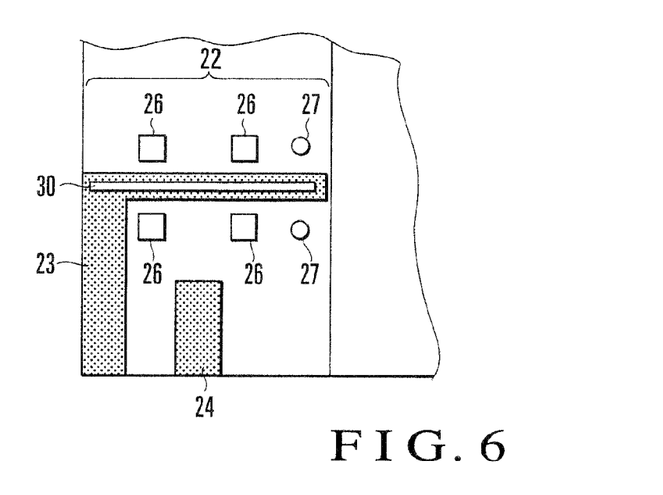
FIG. 6 is a partial plan view showing a state before a semiconductor optical amplifier is mounted in FIG. 5.
Figure 7:
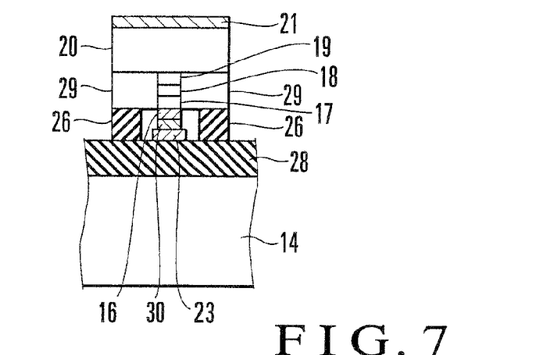
FIG. 7 is a partial sectional view showing a section taken along a line VII-VII' in FIG. 4.
Figure 8:
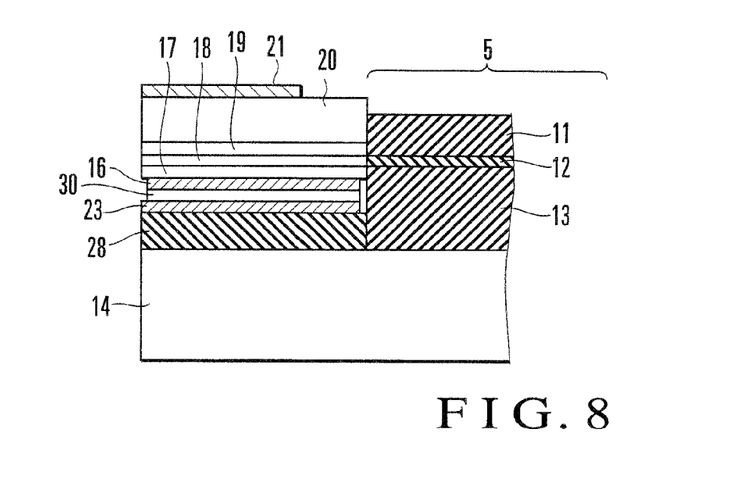
FIG. 8 is a partial sectional view showing a section taken along a line VIII-VIII' in FIG. 4.

In the SOA mounting portion 22, mounts 26 made of, e.g., an $SiO_2$ film are formed on an insulating film 28 on a substrate 14, as shown in FIGS. 6 and 7. The mounts 26 are so high as to make an active layer 18 of the SOA 4 flush with a core layer 12 of a connection waveguide 8 when the SOA 4 is pressed against and mounted on the mounts 26 (FIGS. 7 and 8). The SOA mounting portion 22 provided on the substrate 14 has a substrate-side p-electrode interconnection 23 and a substrate-side n-electrode interconnection 24 which are connected to the mounted SOA 4. The SOA mounting portion 22 has first alignment marks 27 formed from a metal film. The SOA 4 also has, on its surface, second alignment marks (not shown) made of a metal film pattern at positions corresponding to the first alignment marks 27.

The SOA 4 will be described. As shown in FIG. 7, a side where an n-electrode 21 is formed is arranged on the upper side of the substrate 14. That is, the SOA 4 is mounted while directing the surface with the active layer 18 toward the SOA mounting portion 22. The mounts 26 are arranged in the region of a buried layer 29 to form a current constriction structure. A p-electrode 16 arranged on the side of the substrate 14 is connected to the substrate-side p-electrode interconnection 23 through a conductive fusing material 30. The n-electrode 21 is connected to the substrate-side n-electrode interconnection 24 by a bonding wire 25. The remaining components are the same as in the SOA 4 shown in FIG. 3.

Figure 4:
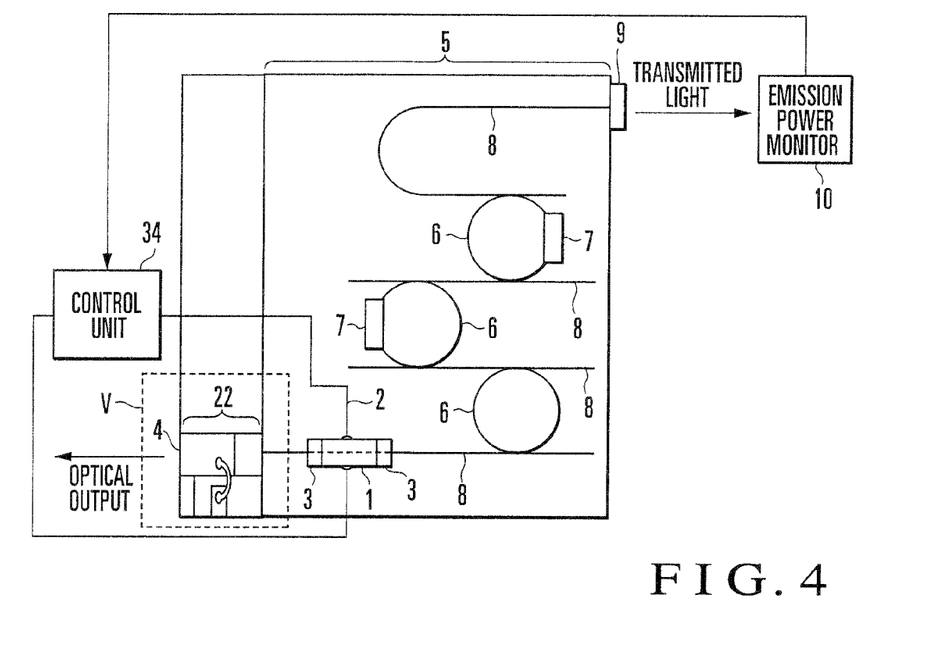
FIG. 4 is a plan view showing the arrangement of a light-emitting element according to the second embodiment of the present invention.
Figure 5:
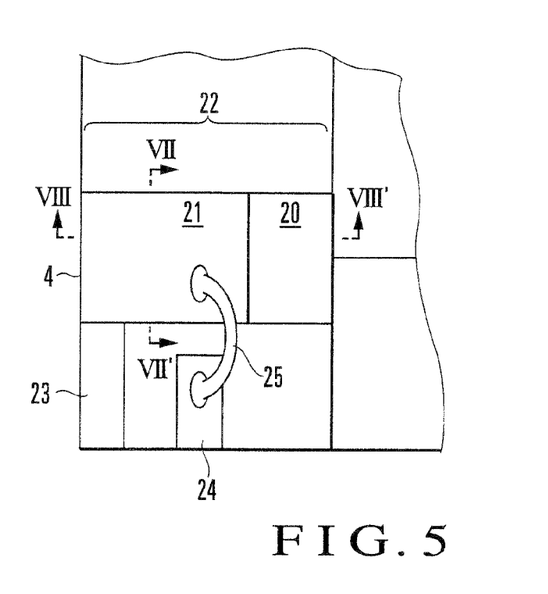
FIG. 5 is a partial enlarged plan view showing a region V in FIG. 4.

The arrangement of the light-emitting element of this embodiment will be described next with reference to FIGS. 4 to 6 especially in association with a method of aligning and fixing the SOA 4 in the SOA mounting portion 22. First, the SOA 4 is placed on the SOA mounting portion 22. The SOA 4 is placed in such a direction that the waveguide extension of the SOA 4 matches the connection waveguide 8 which receives light from the SOA 4. At this time, the SOA 4 is not fixed in the SOA mounting portion 22 yet, and the positional relationship between them can be adjusted.

In this state, a transmitted infrared image in a direction (normal direction to the drawing surface of FIGS. 4 to 6) perpendicular to the SOA mounting portion 22 is monitored. The optical axes of the SOA 4 and SOA mounting portion 22 are aligned in the horizontal direction by using the alignment marks 27 formed on the SOA mounting portion 22 and the alignment marks (not shown) formed on the SOA 4. For example, the SOA 4 is aligned (optical axis is aligned) by superimposing the alignment marks 27 on those of the SOA 4 in the transmitted infrared image. When the respective alignment marks are arranged to allow alignment of the optical axis of the SOA 4 by superimposing the alignment marks of the SOA 4 on the alignment marks 27, optical axis alignment can easily be done by the above-described procedure.

After the above-described optical axis alignment in the horizontal direction finishes, the SOA 4 with the aligned optical axis is pressed toward the SOA mounting portion 22. Simultaneously, the SOA mounting portion 22 is heated to the melting point of the fusing material 30 or more and then cooled down to the melting point or less. With this process, the SOA 4 is fixed while aligning its optical axis with that of the SOA mounting portion 22. The remaining manufacturing processes are the same as those of the light-emitting element of the above-described first embodiment.

The operation and effect of the light-emitting element of this embodiment will be described next. In the light-emitting element of the first embodiment, in combining and fixing the SOA 4 and ring resonator type tunable filter unit 5, the SOA 4 is caused to emit light. In this state, the optical axis needs to be aligned and fixed by, e.g., monitoring the detection signal from the emission power monitor 10. In other words, in the light-emitting element of the first embodiment, it is necessary to align and fix the optical axis by so-called active alignment. Hence, the manufacturing process is complex, and automation is difficult, resulting in an increase in manufacturing cost.

According to the light-emitting element of this embodiment, it is unnecessary to cause the SOA 4 to emit light in aligning and fixing it. In other words, the light-emitting element of this embodiment enables to align and fix the optical axis by so-called passive alignment. Since this simplifies the manufacturing process and facilitates process automation, the manufacturing cost decreases. Even the light-emitting element of this embodiment can provide the same effect as in the first embodiment.

Third Embodiment

Figure 9:
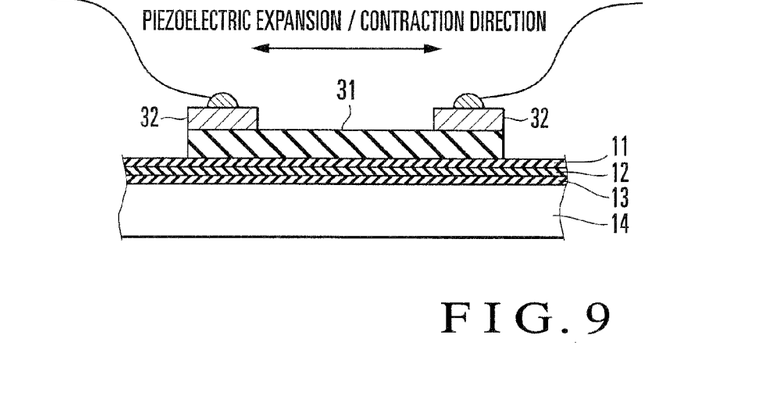
FIG. 9 is a sectional view showing the arrangement of part of a light-emitting element according to the third embodiment of the present invention.

A light-emitting element according to the third embodiment of the present invention will be described next with reference to FIG. 9. FIG. 9 shows another arrangement of the piezoelectric element 1 according to the first embodiment. The light-emitting element of this embodiment has a piezoelectric material film (stress application unit) 31 in contact with an $SiO_2$ upper cladding layer 11. Electrodes 32 are formed on the piezoelectric material film 31 at two ends in the waveguide direction. It is possible to apply stress to a connection waveguide 8 including a lower cladding layer 13, core layer 12, and upper cladding layer 11 by applying a voltage across the two electrodes 32, like the light-emitting element in the first embodiment. This allows to change the refractive index and physical length of the connection waveguide 8 to control the phase of the light and obtain the best oscillation characteristic, like the light-emitting element of the first embodiment.

A method of manufacturing the light-emitting element of this embodiment will be described next. After the upper cladding layer 11 is formed, for example, a lead zirconate titanate film (PZT film) serving as the piezoelectric material film 31 is formed by, e.g., aerosol deposition. Then, the electrodes 32 are formed by known photolithography, etching, and electrode formation processes. The remaining manufacturing processes are the same as those of the light-emitting element of the first embodiment.

In the light-emitting element with this arrangement, the piezoelectric material film 31 is monolithically integrated with a ring resonator type tunable filter unit 5. It is therefore unnecessary to individually assemble the separate components, i.e., the ring resonator type tunable filter unit 5 and piezoelectric element 1, unlike the light-emitting element shown in FIG. 1, and reduce the manufacturing cost.

Fourth Embodiment

Figure 10:
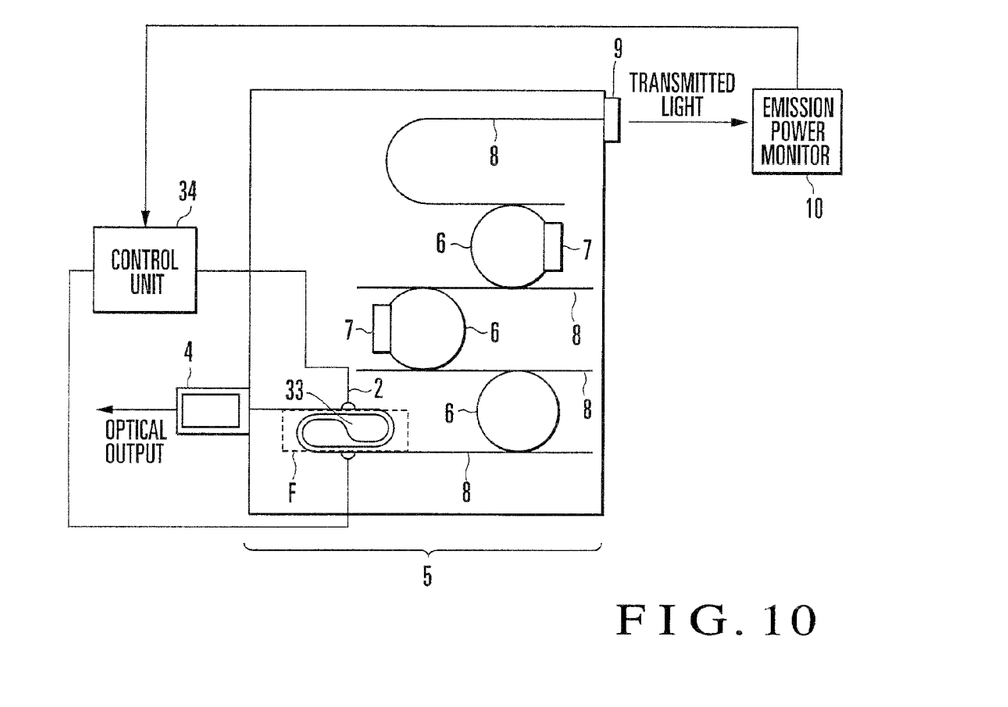
FIG. 10 is a plan view showing the arrangement of a light-emitting element according to the fourth embodiment of the present invention.

A light-emitting element according to the fourth embodiment of the present invention will be described next with reference to FIG. 10. In the light-emitting element of this embodiment, a spiral waveguide 33 which is formed from a bent waveguide portion and passes through, a plurality of number of times, a region where a piezoelectric element 1 is arranged in a region F of a connection waveguide 8 that receives light from an SOA 4. The piezoelectric element 1 is arranged on the spiral waveguide 33. The light-emitting element of this embodiment is the same as that of the first embodiment except that the spiral waveguide 33 is used.

In the light-emitting element of this embodiment with the above-described arrangement, the waveguide that receives stress from the piezoelectric element 1 is longer than that of the light-emitting element of the first embodiment. In the light-emitting element of the first embodiment, the connection waveguide 8 that receives stress from the piezoelectric element 1 has the same length as the piezoelectric element 1 in the piezoelectric expansion/contraction direction. To the contrary, in the light-emitting element of the fourth embodiment, the connection waveguide 8 in the region F which passes under the piezoelectric element 1 serves as the spiral waveguide 33. For this reason, the waveguide that receives stress from the piezoelectric element 1 is longer. As a result, the phase of light can change more largely even when stress applied by the piezoelectric element 1 does not change. This allows to more efficiently change the phase.

In the light-emitting elements of the above-described embodiments of the present invention, a waveguide including a cladding layer of $SiO_2$ and a core layer of SiON is used as a waveguide to which stress is applied. However, the present invention is not limited to this. The same effect as described above can be obtained even by using a waveguide made of another material such as a polymer material. In the above-described embodiments, the piezoelectric effect is used as a stress application means. However, the present invention is not limited to this. Stress may be applied by a stress application unit based on another principle using, e.g., a magnetostrictive material which changes stress depending on an applied magnetic field. The same effect as described above can be obtained even when another mechanical means applies stress.

In the above-described embodiments, stress is applied to the portion of the connection waveguide 8 closest to the SOA 4. However, the present invention is not limited to this. The same effect as described above can be obtained even when stress is applied to another region of the connection waveguide 8 or not the connection waveguide 8 but a portion of the ring resonator 6.

In the light-emitting element of the fourth embodiment, the portion of the connection waveguide 8 closest to the SOA 4 is formed as the spiral waveguide 33, and stress is applied to that portion. However, the present invention is not limited to this. The same effect as described above can be obtained even when another portion of the connection waveguide 8 is formed as a spiral waveguide, and stress is applied to that portion.

In the above-described embodiments, the piezoelectric element 1 serving as a stress application means is fixed at only one part, or the piezoelectric material film 31 is formed at only one part. However, the present invention is not limited to this. The same effect as described above can be obtained even when they are provided at a plurality of parts, or a means for applying stress to the entire ring resonator type tunable filter unit 5 is provided.

In the above-described embodiments, the piezoelectric element 1 or piezoelectric material film 31 is arranged immediately above the connection waveguide 8 or spiral waveguide 33. However, the present invention is not limited to this. The same effect as described above can be obtained even when the piezoelectric element 1 or piezoelectric material film 31 is arranged at a position shifted from the connection waveguide 8 or spiral waveguide 33 to indirectly apply stress. The location of the piezoelectric element 1 or piezoelectric material film 31 is not limited to the upper surface of the ring resonator type tunable filter unit 5. The same effect as described above can be obtained even when they are located on the side surface or lower surface.

A gel material may be injected between the SOA 4 and the ring resonator type tunable filter unit 5 to improve the coupling characteristic. In the above-described embodiments, the SOA 4 is optically directly coupled to the ring resonator type tunable filter unit 5. However, the present invention is not limited to this. The same effect as described above can be obtained even when one or a plurality of optical lenses are inserted between them. In the above-described embodiments, a ring resonator type tunable filter unit is used as a wavelength filter. However, the present invention is not limited to this. The same effect as described above can be obtained even by using a wavelength filter based on another principle.

The above-described light-emitting element is usable as a tunable light source for, e.g., a WDM transmission system. The above-described light-emitting element includes a laser.

As described above, the above-described light-emitting element comprises a stress application unit for directly or indirectly applying stress to at least a partial region of a planar light waveguide arranged in an external resonator and changes the refractive index and physical length of the planar waveguide depending on the stress applied by the stress application unit. This enables to provide a light-emitting element which is free from light absorption loss and can stabilize the oscillation characteristic and reduce the manufacturing cost.

What is claimed is:

1. A light-emitting element comprising:
   a light amplification unit having a function of amplifying light;
   an external resonator connected to said light amplification unit, said external resonator comprising a planar light waveguide arranged inside said external resonator and a stress application unit which applies stress directly or indirectly to at least a partial region of said planar light waveguide;
   a stress control unit which controls a magnitude of the stress applied to said planar light waveguide by said stress application unit; and
   an emission state monitor that detects optical power of light transmitted from said planar light waveguide, wherein said stress application unit controls the magnitude of the stress on the basis of information from said emission state monitor,
   wherein said planar light waveguide has a spiral waveguide portion extending through a region where said stress application unit is arranged, and said stress application unit applies stress to the spiral waveguide portion.

2. An element according to claim 1, wherein said stress application unit is arranged at one of a position immediately above said planar light waveguide and a position shifted from the position immediately above said planar light waveguide.

3. An element according to claim 1, wherein said stress application unit is essentially made of a piezoelectric material.

4. An element according to claim 1, wherein
   said external resonator further comprises an optical circuit unit including said planar light waveguide, and
   said stress application unit applies stress directly or indirectly to at least a partial region of said optical circuit unit.

5. An element according to claim 4, wherein said optical circuit unit has a reflection function of returning, to said light amplification unit, light output from said light amplification unit.

6. An element according to claim 4, wherein said
   optical circuit unit has a reflection function of returning, of light output from said light amplification unit, only a light component having a specific wavelength to said light amplification unit.

7. An element according to claim 6, wherein said external resonator further comprises a wavelength control unit which controls the specific light wavelength returned to said light amplification unit by said optical circuit unit.

8. An element according to claim 1, wherein said stress application unit controls the magnitude of the stress to maximize the emission power of the lightemitting element.

9. An element according to claim 4, wherein said external resonator further comprises a substrate with said optical circuit unit being formed, the substrate having a region where said light amplification unit is to be mounted.

10. An element according to claim 9, further comprising:
a first alignment mark formed in the region where said light amplification unit is to be mounted; and
a second alignment mark formed at a position corresponding to said first alignment mark in said light amplification unit.

11. An element according to claim 9, wherein said light amplification unit is mounted so that a side with an active layer of said light amplification unit is directed to the region where said light amplification unit is to be mounted.

12. An element according to claim 1, wherein said planar light waveguide and said stress application unit are monolithically integrated.

* * * * *